(12) United States Patent
Jin et al.

(10) Patent No.: US 7,208,419 B2
(45) Date of Patent: Apr. 24, 2007

(54) METHOD FOR FABRICATING SEMICONDUCTOR DEVICE

(75) Inventors: Seung Woo Jin, Kyoungki-do (KR); Bong Soo Kim, Seoul (KR); Ho Jin Cho, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 382 days.

(21) Appl. No.: 10/738,397

(22) Filed: Dec. 17, 2003

(65) Prior Publication Data
US 2004/0161936 A1    Aug. 19, 2004

(30) Foreign Application Priority Data
Feb. 19, 2003   (KR) .................... 10-2003-0010346

(51) Int. Cl.
*H01L 21/302*   (2006.01)
(52) U.S. Cl. .................... 438/705; 438/724; 438/744
(58) Field of Classification Search ............. 438/705, 438/724, 744
See application file for complete search history.

(56) References Cited

U.S. PATENT DOCUMENTS

| | | | |
|---|---|---|---|
| 5,858,831 A | 1/1999 | Sung | |
| 6,180,464 B1 | 1/2001 | Krivokapic et al. | |
| 6,180,472 B1 * | 1/2001 | Akamatsu et al. | 438/303 |
| 6,187,675 B1 | 2/2001 | Buynoski | |
| 6,268,253 B1 | 7/2001 | Yu | |
| 6,297,132 B1 | 10/2001 | Zhang et al. | |
| 6,747,294 B1 * | 6/2004 | Gupta et al. | 257/127 |
| 2002/0192868 A1 * | 12/2002 | Kim | 438/112 |
| 2003/0155595 A1 * | 8/2003 | Okita | 257/295 |

* cited by examiner

Primary Examiner—Binh X. Tran
(74) Attorney, Agent, or Firm—Ladas & Parry LLP

(57) ABSTRACT

The present invention relates to a method for fabricating a semiconductor device. The method comprises the steps of: forming a gate line on a semiconductor substrate; forming a buffer layer and a spacer nitride film on the entire surface of the substrate including the gate line; selectively etching the buffer layer and the spacer nitride film in such a manner that they remain on both sides of the gate line; performing an ion implantation process using the remaining buffer layer and spacer nitride film as a barrier film to form junction regions in the semiconductor substrate at both sides of the gate line; forming an interlayer insulating film on the entire upper portion of the resulting substrate; selectively removing the interlayer insulating film to form contact holes exposing the upper surface of the junction regions; and forming contact plugs in the contact holes.

22 Claims, 3 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and more particularly to a method for fabricating a semiconductor device, which allows the short-channel effect and refresh property of the semiconductor device to be improved.

2. Description of the Prior Art

In a fabricating method of a semiconductor device according to the prior art, a gate line is first formed on a silicon substrate where a cell region and a peripheral region are defined. Then, the entire upper portion of the resulting substrate is subjected to an oxidation process to form an oxide film thereon. Next, lightly doped drain (LDD) regions are formed in the silicon substrate at both sides of the gate line by an ion implantation process, and then, a buffer oxide film and a nitride film are deposited on the substrate to a small thickness. Thereafter, N-type junctions are formed in the silicon substrate at both sides of the gate line by an ion implantation process, and in order to secure the space between the gate line and a plug, a spacer nitride film is then deposited on the substrate.

Furthermore, in order to increase the current of the cell region, a polysilicon layer for plugs is deposited to form plugs, and then the resulting substrate is subjected to a high temperature rapid thermal annealing (RTA) process.

In such a prior art, as a semiconductor device becomes fine, the space between the gate lines and the N-type junctions is reduced. Thus, there is a problem in that the short channel margin between a source region and a drain region becomes insufficient.

Another problem is that the gradual effect between the channel region and the junction region is reduced due to out-diffusion effect caused by the RTA process to increase electric field and thus gate-induced drain leakage (GIDL) current, thereby deteriorating refresh property. Also, LtRAS failure rate in a probe test is increased to reduce yield.

SUMMARY OF THE INVENTION

Accordingly, the present invention has been made to solve the above-mentioned problems occurring in the prior art, and an object of the present invention is to provide a method for fabricating a semiconductor device, in which a junction region is formed using the buffer layer and the spacer nitride film as a buffer layer, and then immediately an RTA process is performed, so that out-diffusion from a polysilicon layer for plugs, which is caused by the RTA process, can be minimized to improve short-channel effect, the gentle doping profile of a gate line and a junction region can be created to improve refresh property To achieve the above object, the present invention provides a method for fabricating a semiconductor device, which comprises the steps of: forming a gate line on a semiconductor substrate; forming a buffer layer and a spacer nitride film on the entire upper surface of the substrate including the gate line; selectively etching the buffer layer and the spacer nitride film in such a manner that they remain on both sides of the gate line; performing an ion implantation process using the remaining buffer layer and spacer nitride film as a barrier film to form junction regions in the semiconductor substrate at both sides of the gate line; forming an interlayer insulating film on the entire upper surface of the resulting substrate; selectively removing the interlayer insulating film to form contact holes exposing the upper surface of the junction regions; and forming contact plugs in the contact holes.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

FIGS. 1A to 1E are cross-sectional views for illustrating a method for fabricating a semiconductor device according to a preferred embodiment of the present invention.

Figure 1A:
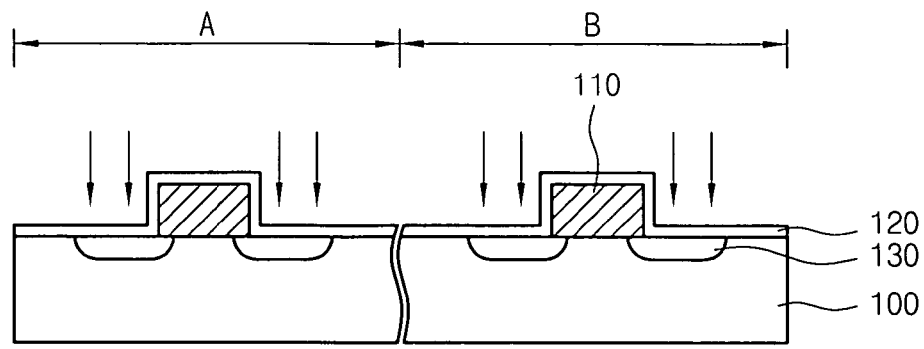
FIGS. 1A to 1E are cross-sectional views for illustrating a method for fabricating a semiconductor device according to a preferred embodiment of the present invention.

As shown in FIG. 1A, a gate line 110 is formed on a semiconductor substrate 100 where a cell region A and a peripheral region B are defined. Then, an oxidation process to heal damages caused by the gate etching process is performed to form an oxide film 120 on the entire surface of the substrate 100 including the gate line 110.

Thereafter, impurity ions are implanted into the cell region A and the peripheral region B to form lightly doped drain (LDD) regions 130 in the substrate 100 at both sides of the gate line 110.

Figure 1B:
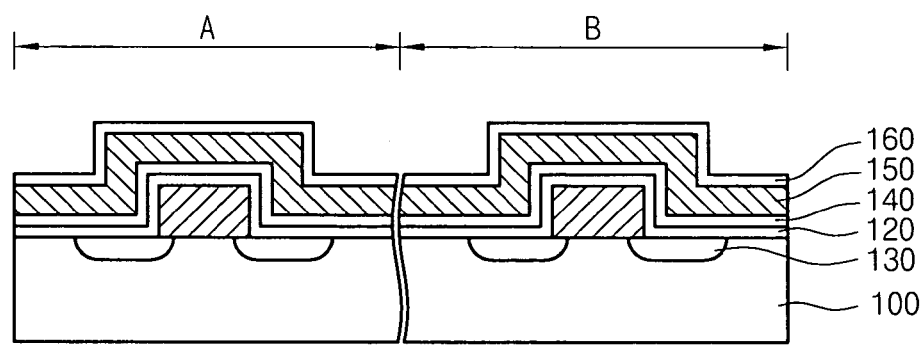

As shown in FIG. 1b, a buffer film 140 serving as a buffer layer upon a subsequent ion implantation process and also a spacer nitride film 150, are then successively deposited on the entire surface of the oxide film 120. Next, a spacer oxide film 160 is formed on the resulting substrate 100.

The spacer nitride film 150 is deposited to a large thickness of 100–700 Å such that the space between gates and junction regions is easily secured upon a subsequent ion implantation process for forming the junction regions.

The buffer layer may be in the form of a laminated structure of an oxide film and a nitride film, a single-layered oxide film, or a single-layered nitride film.

Figure 1C:
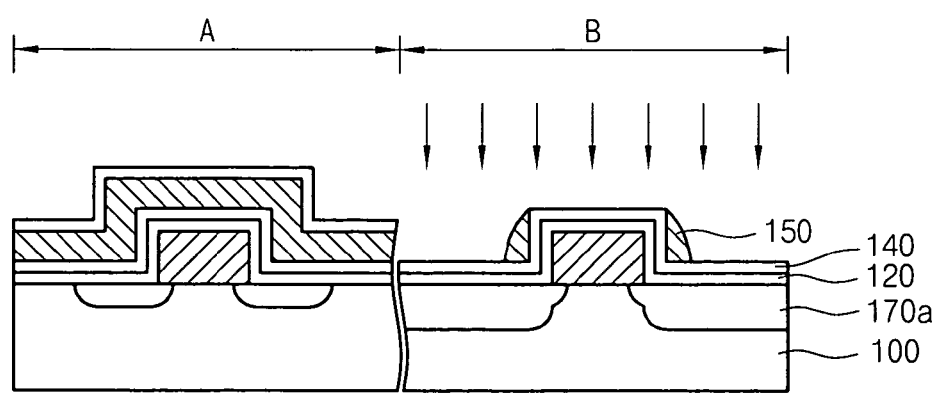

Then, as shown in FIG. 1C, a photoresist mask (not shown) exposing the peripheral region B is applied, after which a portion of the spacer oxide film 160 at the peripheral region B is removed by etching, and the buffer oxide film 140 and the spacer nitride film 150 are selectively etched in such a manner that they remain only on both sidewalls of the gate line 110 and serve as a barrier film upon a subsequent ion implantation process.

The barrier film may be in the form of a laminated structure of an oxide film and a nitride film, a single-layered oxide film, or a single-layered nitride film.

Then, impurity ions are implanted into the peripheral region B using portions of the buffer oxide film 140 and the spacer nitride film 150 remaining on both sidewalls of the gate line 110, as a barrier film, so that an $N^+$ type junction region or a $P^+$ type junction region 170a is formed in the semiconductor substrate 100 at the peripheral region B. Next, the photoresist mask is removed.

The ion implantation for forming the junction region 170a can be carried out using a tilt angle of 0 to 30° and 2–4 rotations, or performed in one time without tilt angle.

Figure 1D:
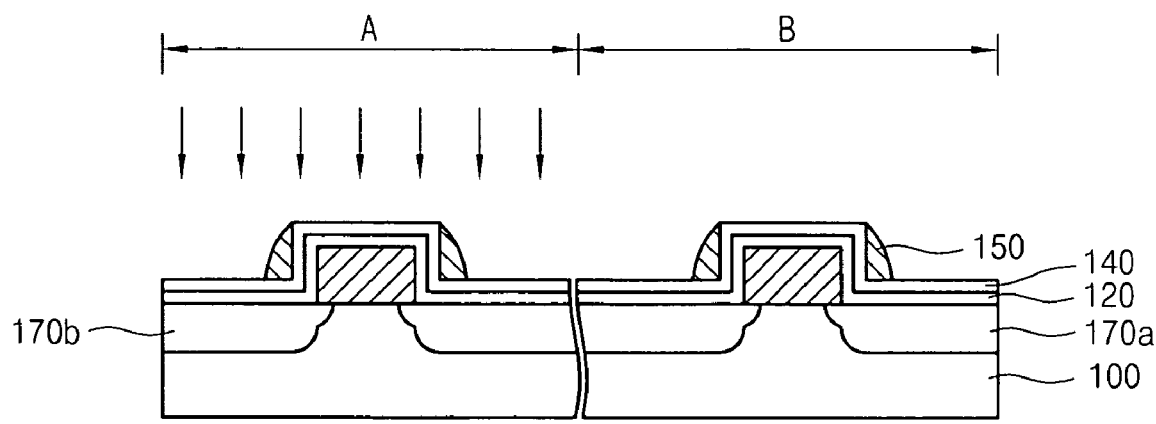

Then, as shown in FIG. 1D, a photoresist mask (not shown) exposing the cell region A is applied on the substrate after which a portion of the spacer oxide film 160 at the cell region A is removed by wet etching.

Next, impurity ions are implanted into the cell region A using the buffer oxide film 140 and the spacer nitride film 150 as a barrier film, so that an N type junction region 170b is formed in the semiconductor substrate 100 at the cell region A. Then, the photoresist mask is removed.

The ion implantation for forming the junction region 170b can be carried out using a tilt angle of 0 to 30° and 2–4 rotations, or performed in one time without tilt angle.

Then, the entire upper portion of the resulting substrate is subjected to a rapid thermal annealing (RTA) process to activate the junction regions 170a and 170b.

Figure 1E:
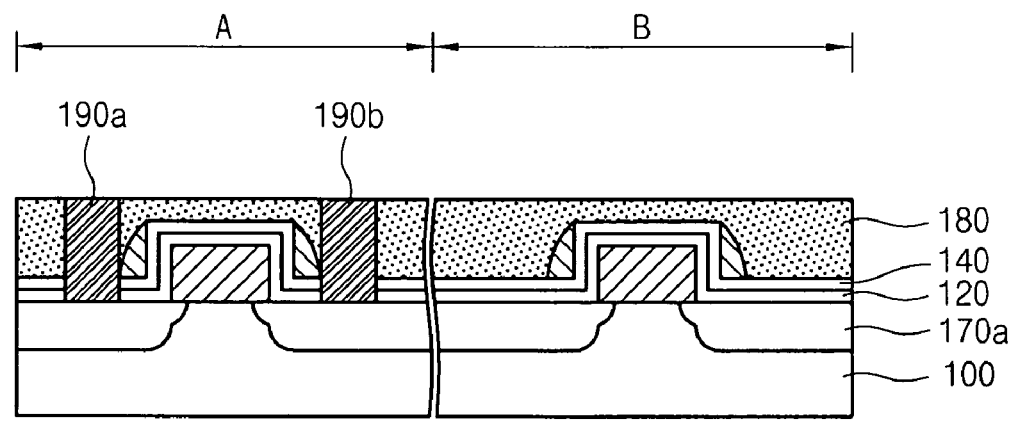

Next, as shown in FIG. 1E, an interlayer insulating film 180 is deposited in such a manner as to be filled in the entire upper portion of the resulting substrate. Thereafter, a bit line contact hole (not shown) and a storage node contact hole (not shown) are formed in the interlayer insulating film 180.

Alternatively, the RTA process may be performed after depositing the interlayer insulating film 180, such that the junction regions 170a and 170b are activated or even voids in the interlayer insulating film 180 can be removed.

Also, the RTA process may be performed after depositing the interlayer insulating film 180 and conducting a furnace thermal process to reflow the deposited film 180, such that the junction regions 170a and 170b are activated or even voids in the interlayer insulating film 180 can be removed.

Thereafter, in order to compensate for dopant loss in the junction regions, which occurs upon the etching process for forming the contact holes, an additional ion implantation process may be carried out.

Then, a polysilicon layer for plugs is formed on the entire upper surface of the resulting substrate, and then planarized, thereby forming contact plugs 190a and 190b in the contact holes.

A high temperature RTA process may be performed before forming the contact plugs 190a and 190b, and a low temperature RTA process may be performed after forming the contact plugs 190a and 190b. This can maximize the current of the cell region.

Subsequent processes are the same as in the prior art and thus the description thereof will not be omitted here.

Figure 2:
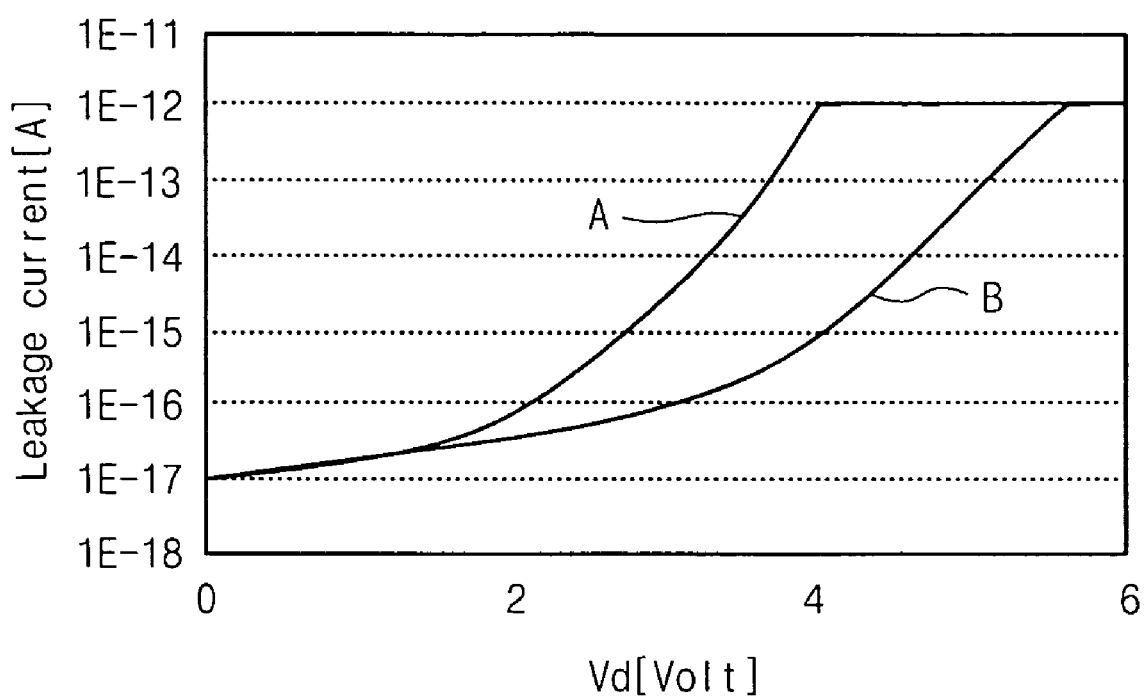
FIG. 2 is a graphic diagram showing the comparison between the GIDL current of a semiconductor device fabricated by the present invention and that of the prior art

Meanwhile, Tables 1 and 2 below and FIG. 2 show the property data and GIDL current of 0.117 μm devices fabricated by a method of the prior art and the method of the present invention.

From FIG. 2, it can be found that the GIDI current B of a semiconductor device fabricated by the method of the present invention is about four times lower than the GIDI current A of the prior art.

TABLE 1

Results of first test

| Items | Prior art | Invention |
|---|---|---|
| 1 cell Vt | 0.92 V | 0.84 V |
| Punch-through breakdown voltage | 5.85 V | 7.10 V |
| Array cell Vt | 0.87 V | 0.79 V |
| Breakdown voltage | 4.29 V | 5.71 V |
| GIDL current | 3.00E–13 A/cell | 3.00E–15 A/cell |

TABLE 2

Results of second test

| STEP | Prior art | Invention |
|---|---|---|
| Vtsat-array (V) | 0.92 V | 0.81 V |
| Idsat-F (μA/cell) | 49 μA | 43 μA |
| Punch-through breakdown voltage (V; 10 pA@-0.8 V) | 4.7 V | 5.4 V |
| Breakdown voltage (V; 10 pA@-0.8 V) | 4.4 V | 5.5 V |
| Cell junction leakage current (fA; 1.8 V@-0.8 V) | 0.012 fA | 0.006 fA |
| GIDL current (fA; 4.0 V@-0.8 V) | 212 fA | 2.4 fA |
| HCD (mV, @Cum 50%) | 50.1 mV | 6.2 mV |
| HCD (mV, @Cum 95%) | 163.7 mV | 29.6 mV |
| Pause (ms, @1E-4%, 82°, median) | 98 ms | 169 ms |
| YMC (ms, @1E-4%, 82°, median) | 111 ms | 186 ms |
| tWR (ms, @1E-4%, 82°, median) | 9.0 ns | 7.5 ns |

As can be seen from Table 2, when the method of the present invention is applied, the punch-through property between source/drain regions is improved while refresh property is about 70 ms improved. Also, the hot carrier degradation (HCD) of a cell transistor is about 134 mV improved.

As described above, the method of the present invention has the effect of minimizing the out-diffusion from a polysilicon layer for plugs, caused by a high temperature RTA process, to improve short-channel effect.

Furthermore, according to the method of the present invention, the gentle doping profile of the gate and the N-type junction can be created to improve refresh property, and the hot carrier degradation of a cell transistor can be improved.

Moreover, according to the method of the present invention, GIDL current can be improved by about four times as compared to the prior art, and breakdown voltage can be improved by 1.5V as compared to the prior art. Thus, refresh property is improved by more than 70 ms, and also tWR (Write Recovery time). This attributes to a higher junction concentration in the present invention than the prior art.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, which comprises the steps of:
   forming a gate line on a semiconductor substrate;
   forming successively a buffer layer, a spacer nitride film, and a spacer oxide film on the entire surface of the substrate including the gate line;
   selectively etching the buffer layer and the spacer nitride film in such a manner that they remain on both sides of the gate line;
   performing an ion implantation process using the remaining buffer layer and spacer nitride film as a barrier film to form junction regions in the semiconductor substrate at both sides of the gate line;
   subjecting the entire upper portion of the substrate including the junction regions to a rapid thermal annealing (RTA) process;
   forming an interlayer insulating film on the entire upper portion of the resulting substrate;

selectively removing the interlayer insulating film to form contact holes exposing the upper surface of the junction regions; and forming contact plugs in the contact holes.

2. The method of claim 1, wherein the buffer layer is in the form of a laminated structure of an oxide film and a nitride film, a single-layered oxide film, or a single-layered nitride film.

3. The method of claim 1, wherein the spacer nitride film is formed to a thickness of 100–700 Å.

4. The method of claim 1, wherein the ion implantation process is performed in one time without tilt angle.

5. The method of claim 1, wherein the ion implantation process is performed using a given tilt angle and a given number of rotations.

6. The method of claim 5, wherein the tilt angle is 0 to 30° and the number of rotations is 2 to 4.

7. The method of claim 1, which additionally comprises the step of performing a rapid thermal annealing (RTA) process after the step of forming the interlayer insulating film.

8. The method of claim 7, wherein the buffer layer is in the form of a laminated structure of an oxide film and a nitride film, a single-layered oxide film, or a single-layered nitride film.

9. The method of claim 7, wherein the spacer nitride film is formed to a thickness of more than 90 Å.

10. The method of claim 7, wherein the ion implantation process is performed in one time without tilt angle.

11. The method of claim 7, wherein the ion implantation process is performed using a given tilt angle and a given number of rotations.

12. The method of claim 11, wherein the tilt angle is 0 to 30° and the number of rotations is 2 to 4.

13. The method of claim 1, which additionally comprises the step of subjecting the interlayer insulating film to a reflow annealing process and a rapid thermal annealing process after the step of forming the interlayer insulating film.

14. The method of claim 13, wherein the buffer layer is in the form of a laminated structure of an oxide film and a nitride film, a single-layered oxide film, or a single-layered nitride film.

15. The method of claim 13, wherein the sapacer nitride film is formed to a thickness of more than 90 Å.

16. The method of claim 13, wherein the ion implantation process is performed using a given tilt angle and given number of rotations.

17. The method of claim 16, wherein the tilt angle is 0 to 30° and the number of rotations is 2 to 4.

18. The method of claim 1, which additionally comprises the step of performing a high temperature rapid thermal annealing process before forming the contact plugs, and the step of a low temperature rapid thermal annealing process after forming the contact plugs.

19. The method of claim 18, wherein the buffer layer is in the form of a laminated structure of an oxide film and a nitride film, a single-layered oxide film, or a single-layered nitride film.

20. The method of claim 18, wherein the spacer nitride film is formed to a thickness of more than 90 Å.

21. The method of claim 18, wherein the ion implantation process is performed using a given tilt angle and a given number of rotations.

22. The method of claim 21, wherein the tilt angle is 0 to 30° and the number of rotations is 2 to 4.

* * * * *